(12) United States Patent
Rhodes et al.

(10) Patent No.: US 6,940,112 B2
(45) Date of Patent: Sep. 6, 2005

(54) INTEGRATED CAPACITORS FABRICATED WITH CONDUCTIVE METAL OXIDES

(75) Inventors: Howard E. Rhodes, Boise, ID (US); Mark Visokay, Boise, ID (US); Tom Graettinger, Boise, ID (US); Dan Gealy, Kuna, ID (US); Gurtej Sandhu, Boise, ID (US); Cem Basceri, Boise, ID (US); Steve Cummings, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 10/234,351

(22) Filed: Aug. 30, 2002

(65) Prior Publication Data

US 2003/0025142 A1 Feb. 6, 2003

Related U.S. Application Data

(62) Division of application No. 09/546,492, filed on Apr. 10, 2000, now Pat. No. 6,492,241.

(51) Int. Cl.$^7$ .............................................. H01L 21/76
(52) U.S. Cl. ....................... 257/295; 257/301; 257/303
(58) Field of Search ............................ 438/3, 253–256, 438/396–399; 257/303, 301, 295

(56) References Cited

U.S. PATENT DOCUMENTS

| | | | |
|---|---|---|---|
| 5,358,889 A | 10/1994 | Emesh et al. | |
| 5,504,041 A | 4/1996 | Summerfelt | |
| 5,576,928 A | 11/1996 | Summerfelt et al. | |
| 5,600,535 A | 2/1997 | Jow et al. | |
| 5,619,393 A | 4/1997 | Summerfelt et al. | |
| 5,622,893 A | 4/1997 | Summerfelt et al. | |
| 5,702,970 A | 12/1997 | Choi | |
| 5,729,054 A | 3/1998 | Summerfelt et al. | |
| 6,025,020 A | 2/2000 | Chen et al. | |
| 6,133,159 A | * 10/2000 | Vaartstra et al. | ............ 438/758 |
| 6,136,641 A | * 10/2000 | Won et al. | .................. 438/240 |
| 6,218,233 B1 | 4/2001 | Takemura | |
| 6,281,142 B1 | * 8/2001 | Basceri et al. | .............. 438/771 |
| 6,290,880 B1 | * 9/2001 | Ryan et al. | .............. 252/518.1 |
| 6,329,286 B1 | * 12/2001 | Vaartstra | ..................... 438/650 |
| 6,344,413 B1 | 2/2002 | Zurcher et al. | |
| 6,387,790 B1 | 5/2002 | Domenicucci et al. | |
| 6,649,091 B2 | 11/2003 | Ryan et al. | |
| 2001/0026963 A1 | * 10/2001 | Itatani et al. | ............... 438/149 |

OTHER PUBLICATIONS

Abstract of Aoyama, T. et al., Ru electrode deposited by sputtering in ArO$_2$ mixture ambient, *Japanese Journal of Applied Physics, Part 1* vol. 37, No. 10, Oct. 1998, p. 5701–7.

Abstract of Aoyama, T. et al., Interfacial layers between Si and Ru films deposited by sputtering in ArO$_2$ mixture ambient, *Japanese Journal of Applied Physics, Part 2* vol. 37, No. 2B, Feb. 1998, p. L242–4.

\* cited by examiner

*Primary Examiner*—John F. Niebling
*Assistant Examiner*—Jennifer M. Kennedy
(74) *Attorney, Agent, or Firm*—Knobbe, Martens, Olson & Bear, LLP

(57) ABSTRACT

A capacitor for a memory device is formed with a conductive oxide for a bottom electrode. The conductive oxide (RuO$_x$) is deposited under low temperatures as an amorphous film. As a result, the film is conformally deposited over a three dimensional, folding structure. Furthermore, a subsequent polishing step is easily performed on the amorphous film, increasing wafer throughput. After deposition and polishing, the film is crystallized in a non-oxidizing ambient.

5 Claims, 7 Drawing Sheets

INTEGRATED CAPACITORS FABRICATED WITH CONDUCTIVE METAL OXIDES

REFERENCE TO RELATED APPLICATION

The present application is a divisional of U.S. application Ser. No. 09/546,492, filed Apr. 10, 2000 now U.S. Pat. No. 6,492,241.

FIELD OF THE INVENTION

The present invention relates to integrated semiconductor memory cell capacitors. In particular, the present invention relates to a memory cell capacitor fabricated with conductive metal oxides and high dielectric constant materials and a method for manufacturing such a capacitor.

BACKGROUND OF THE INVENTION

A memory cell in an integrated circuit, such as a dynamic random access memory (DRAM) array, typically comprises a charge storage capacitor (or cell capacitor) coupled to an access device, such as a Metal-Oxide-Semiconductor Field Effect Transistor (MOSFET). The MOSFET functions to either apply or remove charge on the capacitor, thus affecting a logical state defined by the stored charge. The amount of charge stored on the capacitor is proportional to the capacitance, $C=kk_0A/d$, where k is the dielectric constant of the capacitor dielectric, $k_0$ is the vacuum permittivity, A is the electrode area and d is the spacing between the electrodes.

As the packing density of memory cells continues to increase, each capacitor must still maintain a certain minimum charge storage to ensure reliable operation of the memory cell. It is thus increasingly important that capacitors achieve a high stored charge per footprint or unit of chip area occupied.

An integrated capacitor generally has a bottom electrode plate, or a storage electrode, and a top electrode plate, or a reference electrode, separated by a dielectric layer. Several techniques have recently been developed to increase the total charge capacity of the cell capacitor without significantly affecting the chip area occupied by the cell. These techniques include increasing the effective surface area of both the storage and reference electrodes by creating folding structures such as those in trench, stack or container capacitors. Such structures better utilize the available chip area by creating three-dimensional shapes to which the conductive electrodes and capacitor dielectric conform. The surface of the electrodes may be further increased by providing a roughened surface to the bottom electrode over which the capacitor dielectric and the top electrode are conformally deposited.

A container capacitor, for example, as shown in FIG. 1, can be formed on top of a semiconductor substrate 100, over MOS transistors 101, 103 fabricated with and upon the substrate 100. A layer of dielectric material 107 is deposited on top of the transistors 101, 103, and a conductive plug 108 is formed through the dielectric. After a process of chemical-mechanical polishing (CMP), another layer of dielectric material 110 is deposited. A container-shaped opening 112 is then formed through the layer 110 to expose the conductive plug 108. A layer of conductive material 114 is then deposited onto the structure to serve as the bottom electrode plate of the capacitor. The material 114 is then polished by another CMP process to isolate capacitors across the array from each other, leaving the film 114 inside the container. A capacitor dielectric layer 116 is then formed, followed by deposition of a top electrode plate 118.

In order to further increase the capacitance of the capacitors, other techniques concentrate on the use of new dielectric materials having a higher dielectric constant "k", often referred to as high-k materials. Such materials include tantalum oxide ($Ta_2O_5$), barium strontium titanate (BST), strontium titanate (ST), barium titanate (BT), lead zirconium titanate (PZT) and strontium bismuth tantalate (SBT). The effective dielectric constants of these materials are significantly higher than conventional dielectrics (e.g., silicon oxides and nitrides). For example, the dielectric constant of silicon oxide is about 3.9, and the dielectric constant of the new materials can range from 20 to 40 for $Ta_2O_5$, up to 300 for BST; the dielectric constants of some materials can be even higher (600 to 800). Using such materials enables the creation of much smaller and simpler capacitor structures for a given stored charge requirement, enabling the packing density dictated by current and future circuit designs.

Difficulties have been encountered, however, in incorporating these materials into fabrication process flows. For example, $Ta_2O_5$, is deposited by chemical vapor deposition (CVD) employing organometallic precursors in a highly oxidizing ambient environment. After deposition, the material is typically annealed to remove carbon. This annealing process is typically conducted in the presence of oxidizing agents, such as oxygen ($O_2$), ozone ($O_3$) or nitrous oxide ($N_2O$ or NO), while volatile carbon complexes are driven out.

Due to the volatility of the reactants and by-products of processes for forming high k materials, surrounding materials are subject to degradation. For example, when the bottom electrode plate is made of metal or polycrystalline silicon (polysilicon), which is connected by a polysilicon or tungsten plug to the silicon substrate, all these materials can be oxidized during the deposition and anneal of the high k material. Although electrodes can be made of noble metals, such as platinum, where the noble metals are not easily oxidized, oxygen can still diffuse through the metal electrodes. Therefore, the surrounding oxidizable materials, including the polysilicon plug and the silicon substrate below, are still subject to degradation.

Oxidation of the electrode, the underlying polysilicon plug or the underlying substrate reduces conductivity of these electrical elements, while oxidation of electrode surfaces adjacent the dielectric reduces cell capacitance due to the formation of a layer of oxide with a relatively low dielectric constant. These problems have been viewed as major obstacles to incorporating high k materials into integrated circuits. Past efforts have therefore focused on using highly conductive diffusion barriers as the bottom electrode plate between the high dielectric material and the oxidizable elements, such as polysilicon plugs.

In order to solve the above problems in making a high-k capacitor, highly conductive metal oxides, such as ruthenium oxide ($RuO_x$) and iridium oxide ($IrO_x$) have been used to form the electrode plates. Such oxides are not corroded by oxidizing atmospheres, making them favorable candidates in avoiding the aforementioned electrode oxidation problem. At the same time, their barrier function can prevent the oxidation of underlying conductive plugs.

However, existing processes for fabricating $RuO_x$/high-k container capacitors with the structure of FIG. 1 has some disadvantages. FIGS. 2A–2D illustrate conventional process steps, and, for the purpose of simplicity, the drawings only show the capacitor container without showing the underlying devices, such as the substrate, the transistors and the conductive plugs.

Referring to FIG. 2A, a crystallized $RuO_x$ film 214 is normally deposited onto the container shaped structure 112 and 110 by using chemical vapor deposition or sputtering deposition. The film 214 can be deposited at high temperatures to form a crystalline film 214 with high conductivity. Unfortunately, a high temperature deposition reduces conformality, as shown in FIG. 2A, where the $RuO_x$ film 214 is thicker at the top rim 220 of the container and thinner at the bottom corner 222. This undesirable configuration will often cause discontinuities in the film 214. Thus, the process margin is limited, especially for circuit designs in which conformal dielectrics are needed.

Referring to FIG. 2B, a chemical mechanical polishing (CMP) process is carried out to polish off the portion of $RuO_x$ film overlying the dielectric 110, leaving a portion 214' inside the container 112. The CMP process, however, can not be efficiently carried out due to the extreme hardness of the crystallized $RuO_x$ film 214. The difficulty of the CMP adversely affects the throughput of the fabrication. Also, because of the non-uniformity of the film deposition, CMP leaves a sharp corner 220' at the top portion of the film. Thus, when the next layer of a high-k dielectric material 216 is deposited, as shown in FIG. 2C, the non-ideal conformality of the structure can cause a fatal defect of the device, especially at the thinning point 224. If the dielectric layer is too thin at this point, the capacitor can be leaky, or even shorted.

Referring to FIG. 2D, a top electrode layer is then deposited on the high-k dielectric. Again, due to imperfect conformality in the previously formed dielectric, there may be a void left inside the container. As is known in the art, such voids can trap moisture and thereby reduce device lifespan.

There is thus a need for a fabrication method of a high-k/metal oxide container capacitor with improved structure conformality and uniformity, which will increase the total capacitance while minimizing leakage of the capacitor.

SUMMARY OF THE INVENTION

One object of the current invention is to provide a new process of fabricating a bottom electrode for an integrated capacitor with a more conformal structure, thereby improving the uniformity and reliability of the capacitor, and also the process window to facilitate integration.

Another objective is to increase the etching efficiency during patterning of a conductive oxide film, particularly by polishing processes.

Another objective is to provide a structure of a container capacitor with a lower electrode plate having less sharp corners, to improve the reliability and decrease the leakage of the capacitor.

In order to achieve the above objectives, the preferred embodiments focus on an improved film deposition process and a film crystallization process for a conductive oxide film. Desirably, the process deposits a metal oxide film, in the preferred embodiment $RuO_x$, under a relatively low temperature, such as will produce an amorphous film. As a result, the metal oxide film is more conformally deposited over a three-dimensional folding structure, uniformly covering the structure. Furthermore, since the amorphous metal oxide film is much softer compared to the crystallized film, subsequent patterning steps can be more efficient so as to increase the manufacturing efficiency and throughput.

In order to increase the conductivity of the metal oxide films, a post-deposition high temperature anneal crystallizes the metal oxide film, desirably in a non-oxidizing ambient. Preferably, this annealing process is conducted after the CMP polishing. As mentioned earlier, the metal oxide film is easier to etch, and particularly easier to polish, in an amorphous state. Moreover, the rim or edge area of the metal oxide film that serves as a bottom electrode plate of the capacitor is made less sharp due to a more conformal deposition. Consequently, the formation of more rounded corners of the bottom electrode plate reduces field strength and the risk of current leakage during operation of the circuit.

A high k capacitor dielectric layer is then formed on top of the bottom electrode plate, followed by formation of a top electrode plate. This top electrode plate, according to another aspect of the invention, is preferably made with the same conductive metal oxide as used for making the bottom electrode, and by a similar process. Accordingly, the top electrode plate is preferably also formed by depositing an amorphous film at a low temperature, and the film is later annealed to crystallize under a high temperature, non-oxidizing environment. The top electrode is preferably patterned (e.g., by conventional photolithography and dry etch) before the annealing step. In other arrangements, the top electrode can be crystalline as deposited, and can be formed of alternative materials.

Other aspects and advantages of the invention will be apparent from the Detailed Description below, and from the appended claims.

BRIEF DESCRIPTION OF THE DRAWINGS

The present invention is described in more detail below in connection with the attached drawings, which are meant to illustrate and not to limit the invention, and in which.

DETAILED DESCRIPTION OF THE PREFERRED EMBODIMENT

Although the present invention is described in the context of fabricating memory devices, those skilled in the art of integrated capacitor fabrication will readily find application for the principles disclosed herein in many other contexts.

Figure 1:
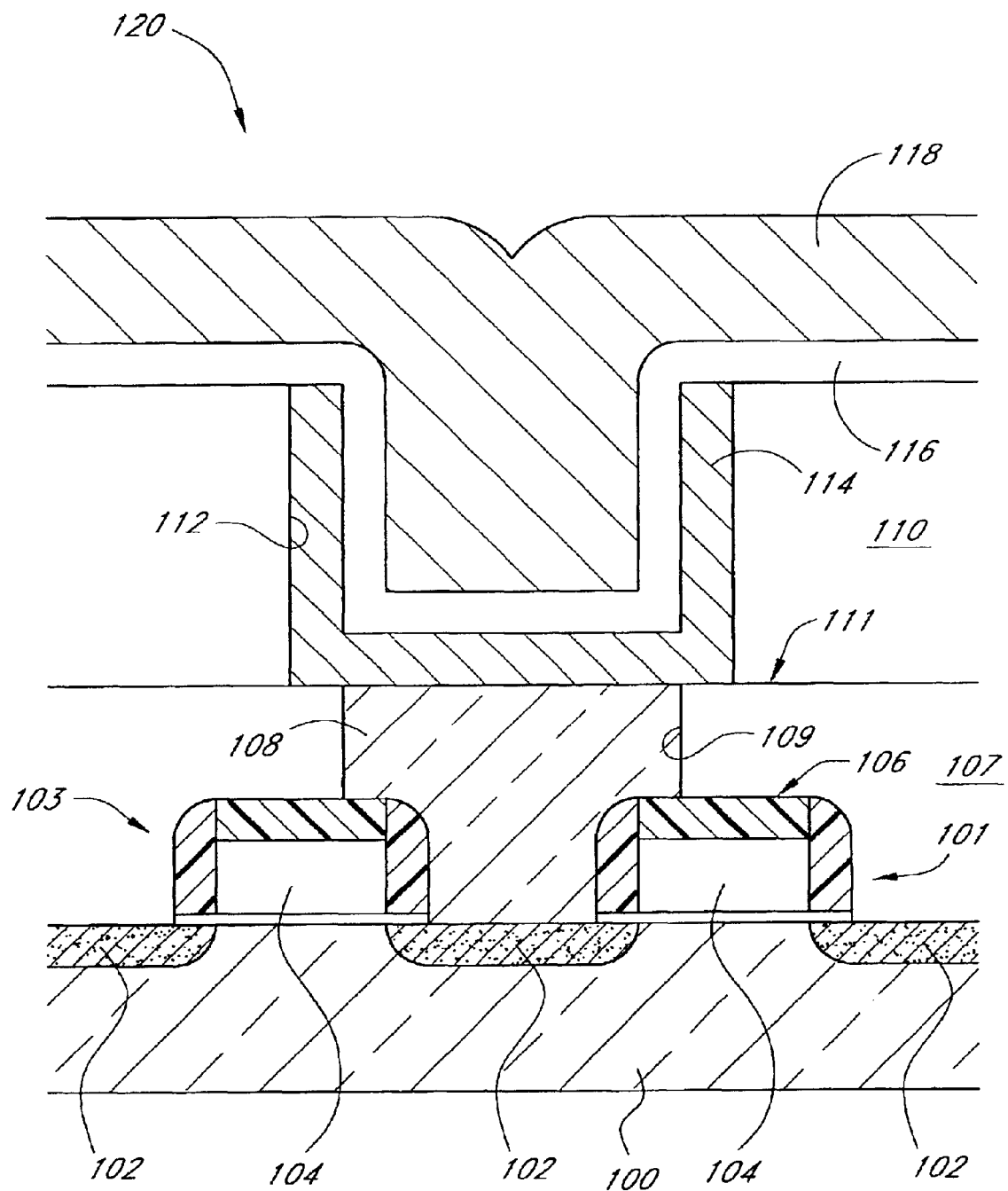
FIG. 1 illustrates a basic structure of a container capacitor fabricated on top of a semiconductor substrate.
Figure 2A:
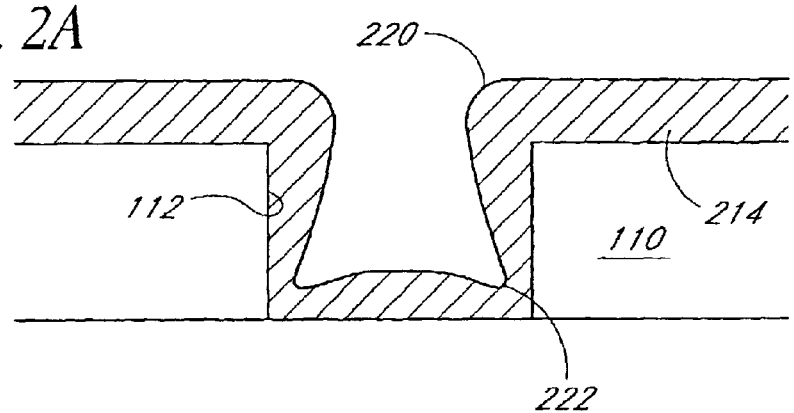
FIGS. 2A–2D are schematic cross-sections of a container capacitor fabricated in accordance with a prior art process.
Figure 2B:
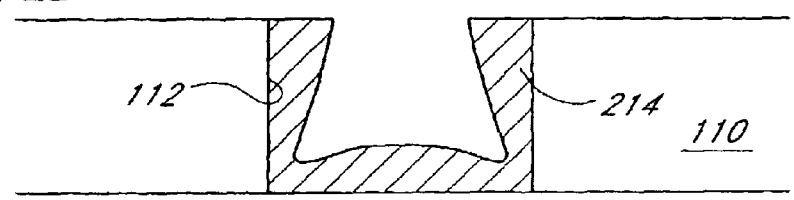
Figure 2C:
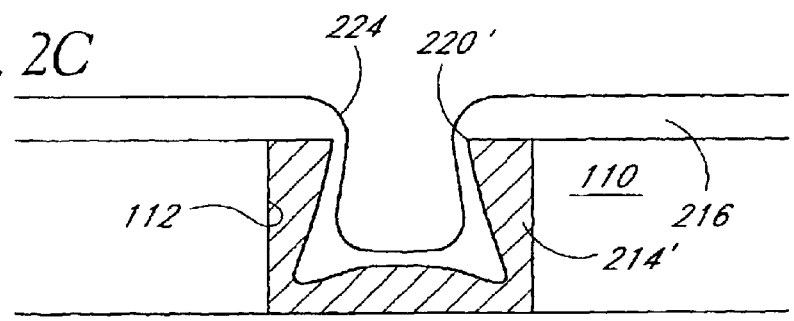
Figure 2D:
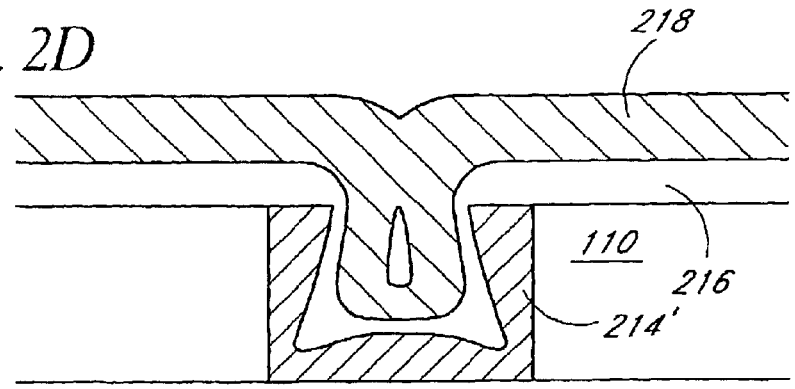

In order to understand the context in which the preferred embodiments are employed, reference is made to FIG. 1, in which a basic structure of a container capacitor is illustrated over a semiconductor substrate 100. As will be understood by the skilled artisan, the substrate 100 can comprise the upper portion of an intrinsically doped, monocrystalline silicon wafer, an epitaxial semiconductor layer, or other semiconductor material in which the lowest level of devices are formed.

As shown in FIG. 1, a plurality of transistors 101, 103 is fabricated in and above the substrate 100, and a first layer of insulating or dielectric material 107 is formed thereover. Generally, this insulating layer 107 comprises a form of oxide, such as borophosphosilicate glass (BPSG). Depending upon the presence or absence of other circuit elements, the first insulating layer 107 can have a thickness between about 0.5 μm to 1.0 μm for state-of-the-art circuit designs.

A conductive contact 108 is shown extending through the first insulating layer 107 to electrically contact an active area 102 between the transistors 101 and 103. In the preferred embodiment, the material of the conductive contact 108 comprises conductively doped polycrystalline silicon. Advantageously, polysilicon can be deposited with good step coverage into deep, narrow contact openings by chemical vapor deposition (CVD), polysilicon is compatible with the exposed substrate 100, and furthermore exhibits a high melting point to withstand further front-end high temperature processing. In accordance with industry terminology, the conductive contact 108 shall be referred to as a "poly plug".

As shown in FIG. 1, the first insulating layer 107 and the conductive plug 108 are provided with a planarized surface 111. Such planarization can be accomplished by mechanical abrasion, preferably chemically aided by etchants in a slurry in a chemical mechanical planarization or polishing (CMP) process.

A container capacitor 120 is then fabricated over the planarized surface 111. As shown in FIG. 1, a second insulating layer or structural layer 110 is then formed over the first insulating layer 107. The structural layer 110 is preferably selectively etchable relative to the underlying first insulating layer 107 or relative to an intervening etch step layer (not shown). For example, the structural layer can comprise an oxide derived from the decomposition of TEOS. Alternatively, the structural layer can also comprise BPSG, in which case an etch stop layer is preferably provided between the first insulating layer 107 and the structural layer 110. The surface area of the container, and thus the capacitance of the memory cell, is influenced by the thickness of this structural layer 110. For the illustrated circuit, the structural layer 110 has a thickness between about 1.0 $\mu$m and 2.0 $\mu$m.

An opening 112 is then formed in the structural layer 110, such as by using photolithography and etching techniques, exposing at least a contact portion of the underneath conductive plug 108. This opening 112 defines a container, in which a container capacitor is to be fabricated. The skilled artisan will readily appreciate other three dimensional folding structures to increase capacitor surface area, including trench capacitors, stacked stud configurations, finned structures, etc.

FIGS. 3A–3F are used to explain the process steps of the preferred embodiment for fabricating a container capacitor. Like reference numerals are used to refer to like parts, up to the formation of container opening 112. For the purpose of simplicity, the drawings only show the portion that includes the container capacitor, without showing underlying substrate, transistors and conductive plug shown in FIG. 1.

A barrier layer 313, typically comprising a metal nitride (e.g., TiN, TaN, WN, etc.) is first formed to intervene between the polysilicon plug 108 (FIG. 1) and the capacitor structure to be formed. The skilled artisan will appreciate that other conductive diffusion barriers, such as $RuSi_x$, $RuSiO_x$, $RuSiN_x$, $RuSiNO_x$, $PtRh_x$, $TiAlN_x$, $TaSiN_x$, and $WSiN_x$, can also be employed. Such a barrier can comprise a layer overlying the plug or, as shown in FIG. 3A, a layer 313 lining the container 112 defined within the structural layer 110.

Figure 3A:
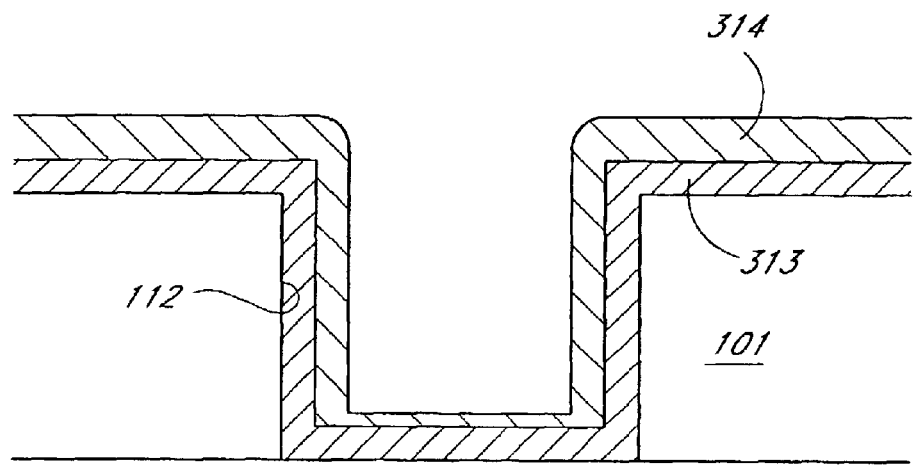
FIGS. 3A–3F are schematic cross-sections of a container capacitor fabricated in accordance with a preferred embodiment of the present invention.

As also shown in FIG. 3A, a conductive oxide film 314 is deposited into the container structure 112, preferably by chemical vapor deposition (CVD). The conductive oxide preferably comprises a metal oxide and more preferably comprises ruthenium oxide ($RuO_x$). The conductive oxide film 314, as deposited, is preferably in an amorphous state which can be controlled by keeping the temperature in a relatively low range. As will be readily appreciated by the skilled artisan, the temperature range in which amorphous metal oxide is formed will depend upon the chemistry for the CVD reaction, as well as the pressure conditions. In the illustrated embodiment, $RuO_x$, is deposited by CVD by reacting an oxygen source with a ruthenium source at relatively low temperatures, in particular by reacting oxygen with tricarbonyl cyclohexadiene ruthenium at a pressure between about 0.1 Torr and 100 Torr. Under these conditions, the temperature is preferably kept below about 350° C., more preferably below 300° C., and most preferably between about 150° C. and 250° C.

This low temperature deposition advantageously provides a conformal and uniformly thin film metal oxide layer 314, alleviating the complications and problems caused by the non-conformal film deposition. In particular, with an aspect ratio greater than about 3:1, the low temperature deposition produces a step coverage greater than about 50%, preferably greater than about 75%, and more preferably greater than about 90%. The skilled artisan will appreciate that "step coverage" is defined as a ratio of field coverage to sidewall coverage in the context of deposition over vias, as in the illustrated embodiment. In view of the present disclosure, the skilled artisan can readily determine appropriate conditions for amorphous deposition of conductive oxides using other chemistries or other pressure conditions.

Figure 3B:
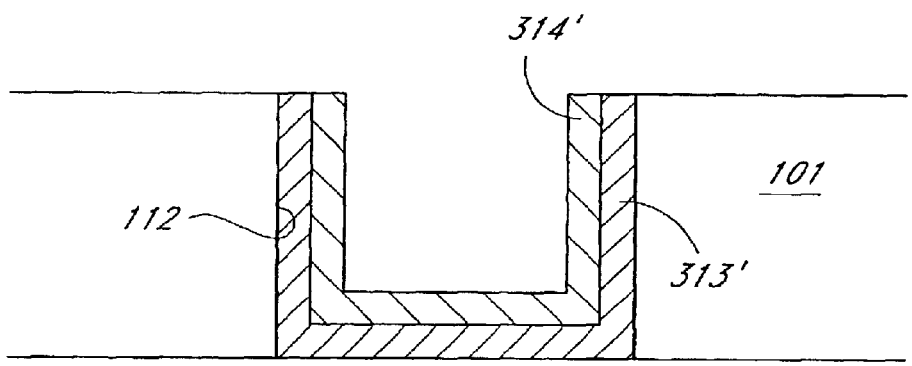

With reference now to FIG. 3B, subsequent to the deposition of the conductive oxide film 314, a CMP process is carried out to planarize and polish off the portion of the barrier layer 313 and conductive oxide film 314 overlying the structural layer 110, leaving portions 313', 314' of those layers inside the container 112. Prior to CMP, the wafer is advantageously coated with resist or spin-on-glass (not shown) to protect the metal oxide film from the slurry particles during the CMP process. Desirably, the metal oxide film remains amorphous, such that it is softer and easier to polish than a crystallized film. This not only saves the expensive CMP materials in the polishing process, for example, the polishing pads and slurry, but also reduces processing time. As a result, wafer throughput is improved.

Following the CMP, the resist or spin-on-glass remaining in the container is removed by either a wet etch or dry strip process. Then a high temperature annealing process is advantageously applied to the conductive oxide layer 314', crystallizing the film to improve conductivity and thermal stability. In the illustrated embodiment, the metal oxide film 314' is preferably annealed in a non-oxidizing environment, such as ammonium ($NH_3$), nitrogen ($N_2$), argon (Ar), helium (He) or other inert gases. Preferably, the anneal is conducted in a nitrogen-containing ambient. The annealing temperature is preferably between about 400° C. and 900° C., more preferably between about 500° C. and 850° C., and most preferably between about 700° C. and 800° C. This annealing process enhances conductivity of the metal oxide film 314' and stabilizes its chemical structure.

Due to the fact that the annealed conductive metal oxide film 314' serves as the bottom electrode plate of the container capacitor, there are some advantages for having the annealing or crystallization process after the CMP step. As a result of the CMP process, a sharp corner is formed at the rim area of the film 314'. Improved conformality due to the low temperature deposition of amorphous metal oxide as discussed above, however, somewhat reduces the sharpness of this corner. Consequently, the more rounded corner of the bottom electrode plate reduces operational field strength and attendant risk of current leakage.

Figure 3C:
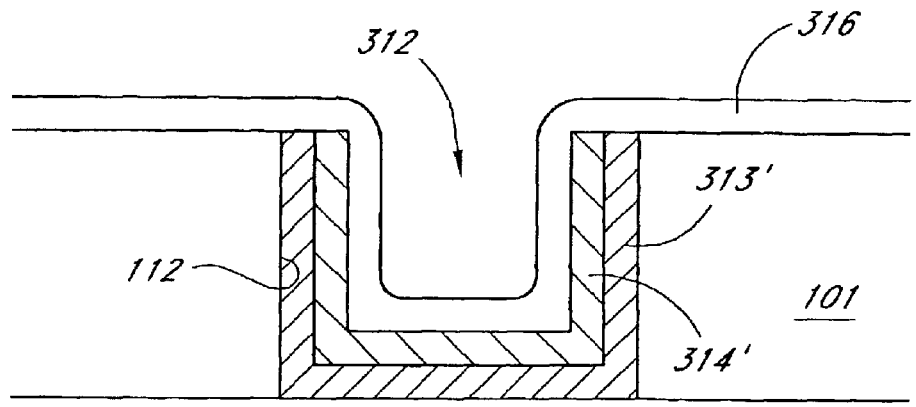

Referring to FIG. 3C, after the formation of the bottom electrode 314', a capacitor dielectric film 316 is deposited onto the container-shaped bottom electrode 314', as well as onto the other areas of the memory array. The dielectric preferably has a high dielectric constant (high k). The term "high k materials", as used herein, refers to materials having dielectric constants significantly higher than that of conventional dielectric materials such as silicon dioxide (k=3.9), and preferably greater than about 9 and more preferably greater than about 20. The high k dielectric layer 316 preferably comprises a metal oxide, and can comprise a complex oxide such those discussed briefly in the "Background" section above. Preferred materials include tantalum oxide, aluminum oxide, barium strontium titanate, strontium titanate, strontium bismuth tantalate, zirconium oxide and lead zirconium titanate. In the illustrated embodiment, the high k material 316 comprises tantalum oxide ($Ta_2O_5$), which can have a k value of about 20 to 40, depending upon the phase and thickness of the material.

It is well known in the art that tantalum oxide can be formed by chemical vapor deposition, using an organometallic precursor, followed by a high temperature anneal to drive out carbon complexes and cure the layer. Typically, the anneal comprises heating the substrate 100 (shown in FIG. 1) to about 800° C. in an oxidizing ambient (e.g. $N_2O$, $O_2$, NO, $O_3$) environment. In the preferred embodiment, however, the anneal is conducted at less than about 600° C. to avoid degradation of the underlying $RuO_x$, film. Preferably, $Ta_2O_5$ is formed to a thickness of approximately 40 Å to 100 Å, and is about 75 Å in the illustrated embodiment.

Figure 3D:
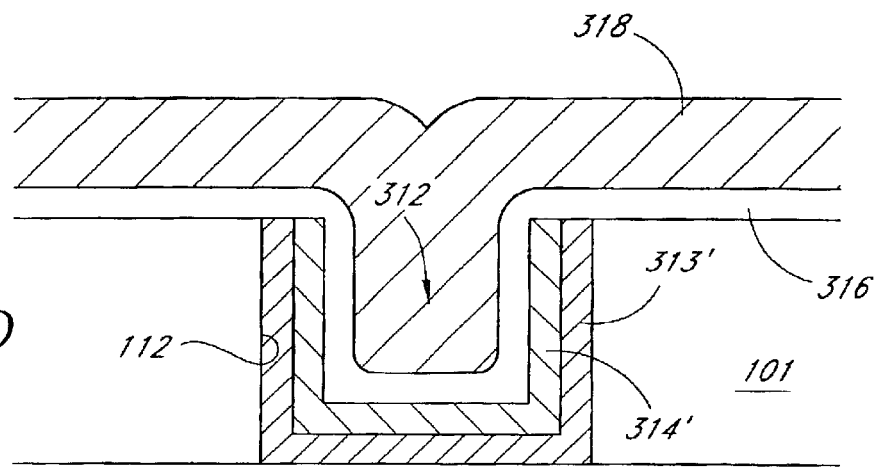

Referring to FIG. 3D, another layer of conductive material 318 is formed on top of the capacitor dielectric material 316, and can fill the container 312 completely, serving as the top electrode plate of the capacitor. The material of this conductive layer 318 can be a conductive oxide or any other suitable conductive material, such as titanium nitride, tantalum nitride, tungsten nitride, doped polysilicon, iridium, rhodium, platinum, ruthenium or combinations of the same. In the illustrated embodiment, the top electrode plate 318 also comprises a conductive oxide. This metal oxide film 318 is also preferably deposited by using CVD deposition technology in an amorphous state with a low temperature deposition technique.

Figure 3E:
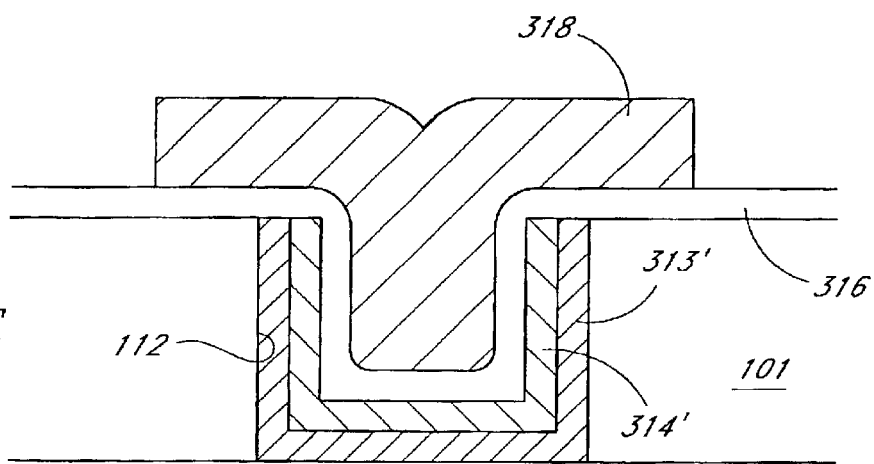

The metal oxide film 318 can be patterned, as shown in FIG. 3E, to form the separate electrode for each capacitor, and is then annealed under a high temperature to crystallize the film and improve conductivity. It will be understood that the top electrode can comprise a common reference electrode across an entire array of memory cells, such that patterning need only isolate arrays from one another, depending upon circuit design. The top electrode 318 is also preferably annealed in a non-oxidizing environment, which involves non-oxidizing gases, such as nitrogen ($N_2$), ammonium ($NH_3$), argon (Ar), helium (He) or other inert gases. The annealing temperature is preferably from about 400° C. to 900° C., more preferably from about 500° C. to 850° C., and most preferably from about 650° C. to 750° C.

Another advantage of using the conductive metal oxides for the top electrode material is that it serves as a high oxygen-content source, inhibiting oxygen diffusion from the underlying high k material 316. This oxygen maintenance is important for any type of high k capacitor, because even a very small amount of oxygen depletion from the high k material 34 can result in conductive charge leakage paths in the capacitor. Suitable conductive oxides include the ruthenium oxide ($RuO_x$) of the illustrated embodiment, as well as iridium oxide ($IrO_x$), and rhodium oxide ($RhO_x$). Where the electrode does not form a volatile compound in the presence of an oxidizing ambient, such as with $IrO_x$, an oxidizing ambient during the crystallizing anneal can be advantageous. Alternatively, since the deposition does not occur over an easily oxidized material, the top electrode can be deposited in crystalline form at higher temperatures.

Figure 3F:
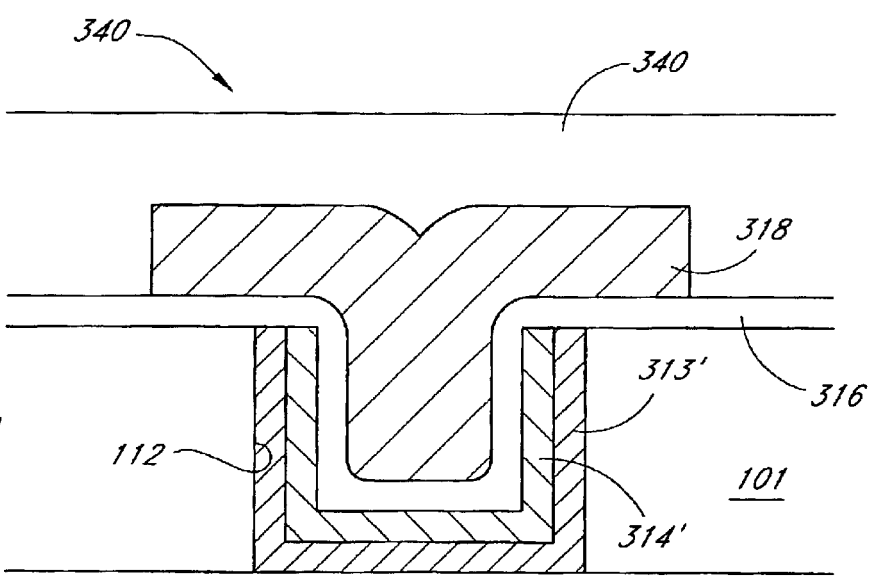

Referring to FIG. 3F, following the formation of the top electrode plate of the capacitor, an interlevel dielectric (ILD) film 320 is deposited on top of the device. Typically, the ILD film 320 comprises a form of oxide, such as TEOS or BPSG. The integrated circuit can then be completed by back-end or metallization process flows.

Figure 4:
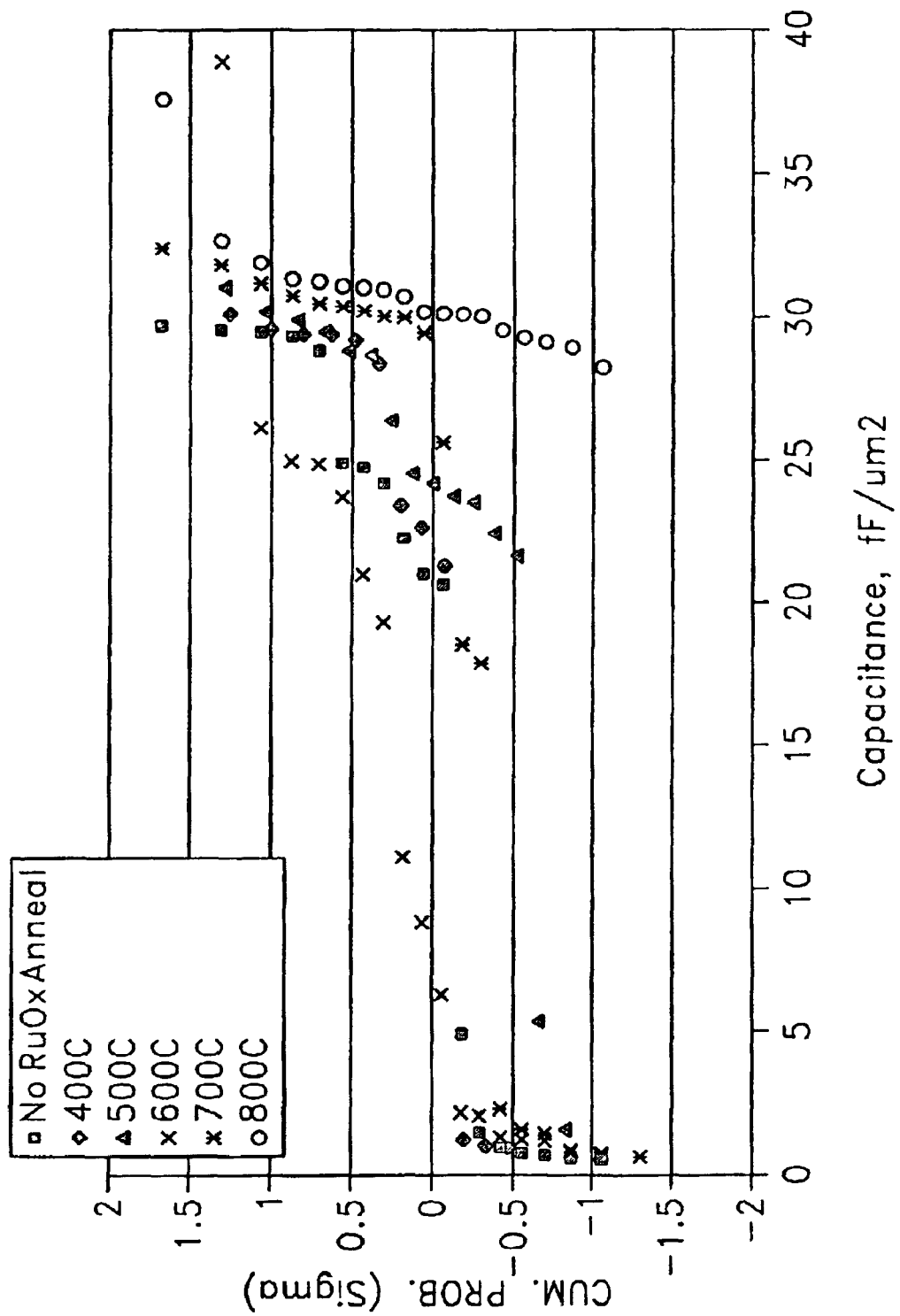
FIGS. 4–6 are charts displaying electrical measurement data from the experiments relating to metal oxide annealing.
Figure 5:
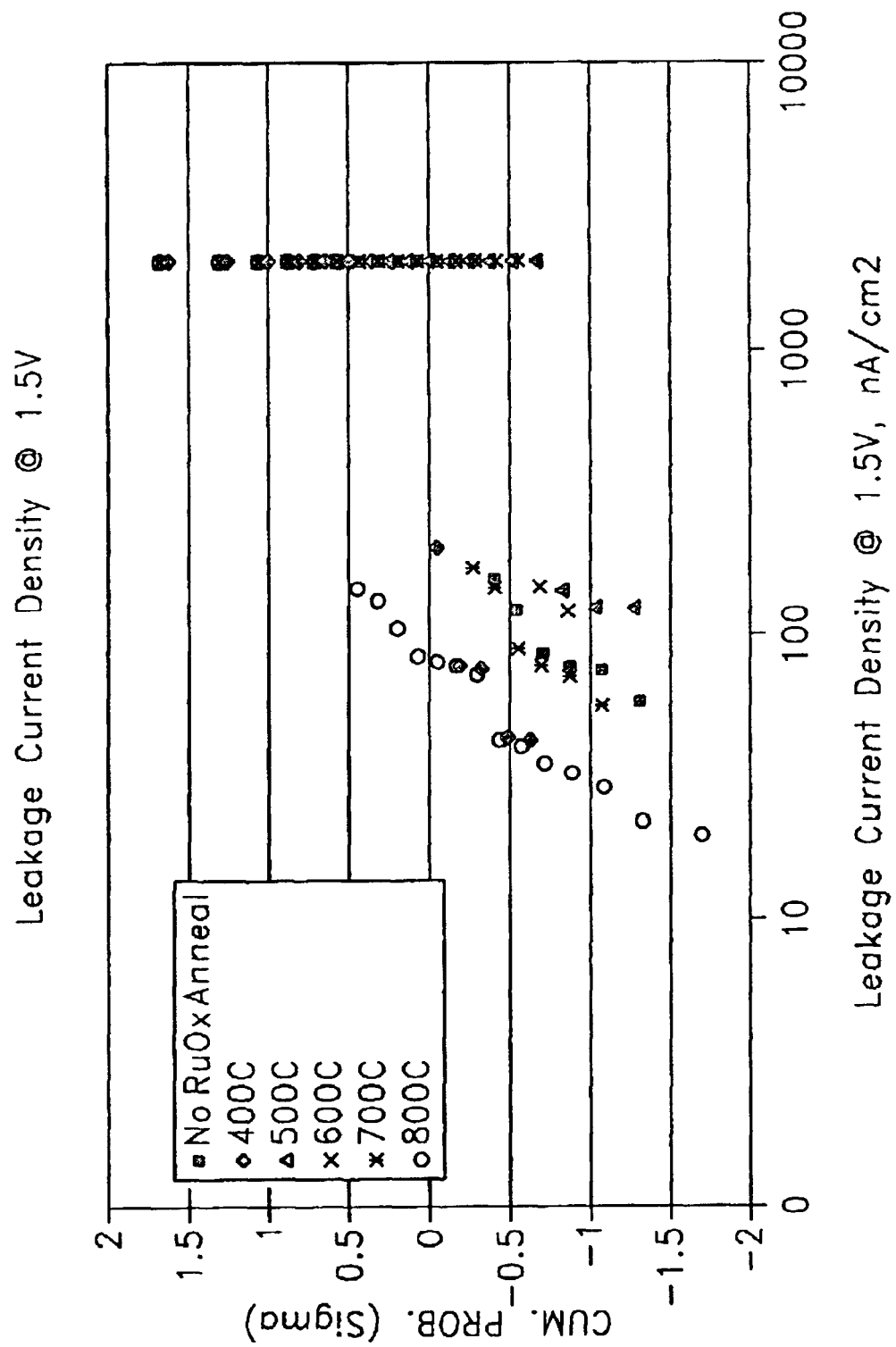
Figure 6:
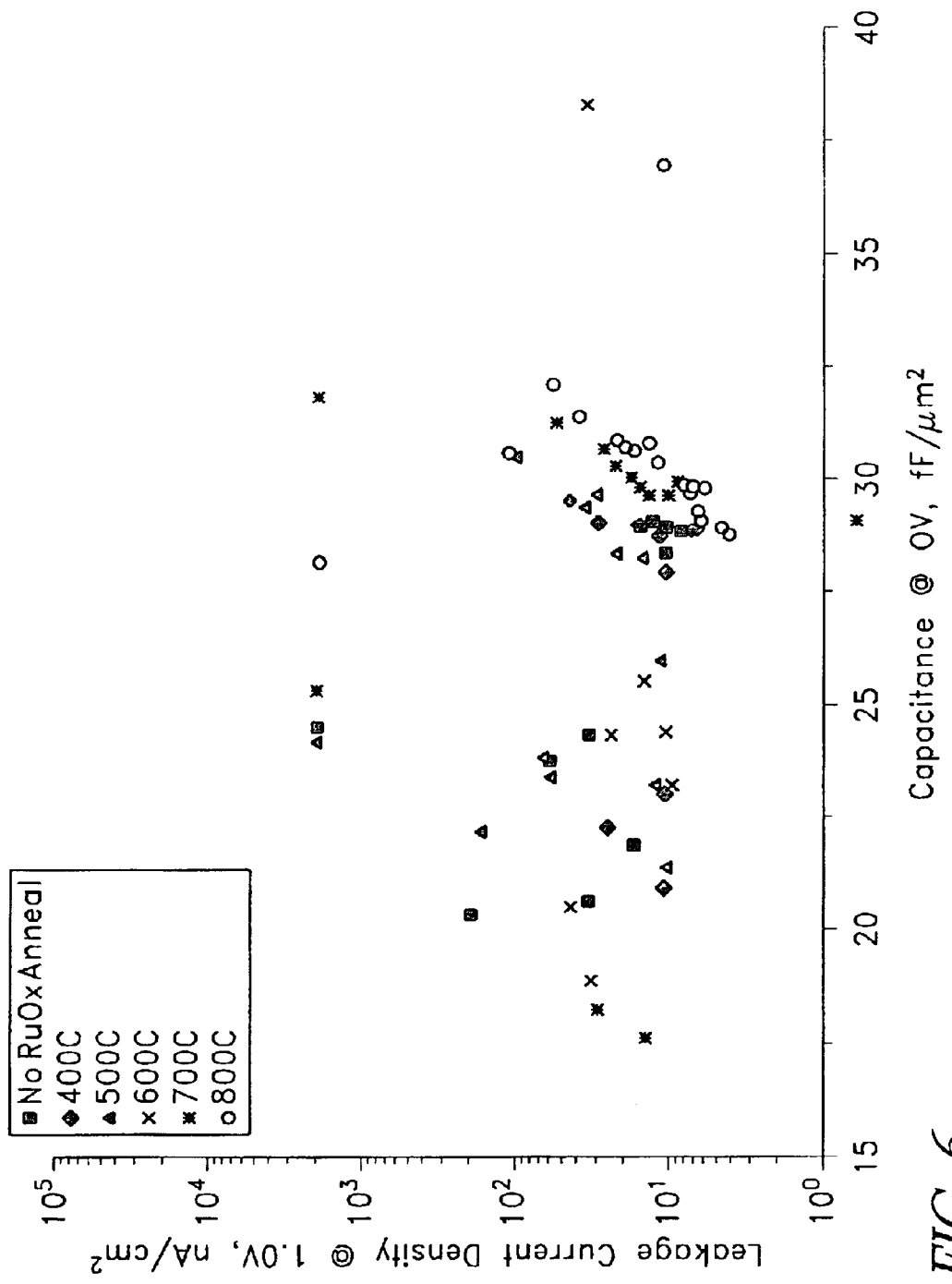

FIGS. 4–6 illustrate the experimental results of crystallizing the amorphous electrode plate, particularly the bottom electrode plate, by using different annealing conditions. FIG. 4 shows the electrical measurement or probe result from a split lot, where a number of wafers are split into several batches, and each batch undergoes a different process condition. In this case, the batches go through the anneal process with one group having no anneal, while the other groups have 400° C., 500° C., 600° C., 700° C. and 800° C., respectively. In FIG. 4, each data point represents the capacitance of one capacitor, and there are 5 measured sites for each wafer being measured.

The results displayed in FIG. 4 clearly demonstrate that the wafers from the annealed group with 700° C. and 800° C. have the highest capacitance, and the increase of the capacitance with anneal under 800° C. is as much as 30 times greater, as compared to the group with no anneal.

FIG. 5 shows that the groups processed at an annealing temperature of 700° C. and 800° C. from the previous experiment have the lowest leakage current compared with other process groups. The decrease of the leakage current, as shown in the chart, is on the order of 80%, as compared to the group with no anneal.

FIG. 6 shows that the groups of 700° C. and 800° C. have higher capacitance and lower leakage as compared to other groups of the split.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A memory cell capacitor in an integrated circuit, comprising a storage electrode formed of a conductive oxide isolated in a container shape having rounded corners, said conductive oxide having a step coverage greater than about 75% within said container, the memory cell capacitor further comprising a conformal capacitor dielectric having a dielectric constant greater than about 9.

2. The memory cell capacitor of claim 1, wherein said capacitor dielectric is selected from the group consisting of tantalum oxide, aluminum oxide, barium strontium titanate, strontium titanate, strontium bismuth tantalate, zirconium oxide and lead zirconium titanate.

3. The memory cell capacitor of claim 1, wherein said capacitor dielectric comprises tantalum oxide.

4. The memory cell capacitor of claim 1, wherein said capacitor dielectric comprises aluminum oxide.

5. A memory cell capacitor in an integrated circuit, comprising a container structure including a conformal storage electrode having a conductive oxide with a step coverage greater than about 90% within said container structure, the memory cell capacitor further comprising a conformal capacitor dielectric having a dielectric constant greater than about 9.

* * * * *